US009035862B2

(12) United States Patent
Sato

(10) Patent No.: US 9,035,862 B2
(45) Date of Patent: May 19, 2015

(54) ELECTRO-OPTIC DEVICE AND ELECTRONIC DEVICE

(75) Inventor: Jun Sato, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 507 days.

(21) Appl. No.: 13/042,736

(22) Filed: Mar. 8, 2011

(65) Prior Publication Data

US 2011/0221733 A1 Sep. 15, 2011

(30) Foreign Application Priority Data

Mar. 10, 2010 (JP) ................................ 2010-053088

(51) Int. Cl.

*G09G 3/36* (2006.01)
*G01R 31/26* (2014.01)
*G09G 3/10* (2006.01)
*G09G 3/00* (2006.01)

(52) U.S. Cl.

CPC .............. *G09G 3/006* (2013.01); *G09G 3/3659* (2013.01); *G09G 3/3688* (2013.01); *G09G 2310/0297* (2013.01)

(58) Field of Classification Search

CPC .............. G09G 3/3258; G09G 3/3659; G09G 2300/0421; G09G 2300/0426; G09G 3/006; G09G 3/3688; G09G 2310/0297

USPC .................. 345/83-104; 324/760.01, 760.02; 315/169.3

See application file for complete search history.

(56) References Cited

U.S. PATENT DOCUMENTS 5,537,054 A 7/1996 Suzuki et al.
6,654,075 B1 * 11/2003 Takeichi et al. ................ 349/43
7,768,000 B2 * 8/2010 Cho et al. ........................ 257/40
8,054,267 B2 * 11/2011 Chen ............................... 345/89
2003/0098708 A1 * 5/2003 Matsueda .................... 324/770

FOREIGN PATENT DOCUMENTS

JP 2516197 B2 4/1996
JP 2006003820 A 1/2006

* cited by examiner

*Primary Examiner* — Ilana Spar

(74) *Attorney, Agent, or Firm* — Lowe Hauptman & Ham, LLP

(57) ABSTRACT

An electro-optic device includes pixel electrodes; a data line block for providing an image signal to a first pixel electrode group and a second pixel electrode group in one column of pixel electrodes arrayed in a line in a first direction, the data line block being configured by data line pairs in which a pair of a first data line and a second data line extending in the first direction is arranged for each column; an image signal supplying unit for sequentially providing an image signal in time-series to each of the data line pairs configuring the data line block from one end of each of the data line pairs; and an inspection voltage supplying unit for supplying an inspection voltage from another end of each of the data line pairs each to the data line block and separately to each of the first data line and the second data line.

11 Claims, 10 Drawing Sheets

ELECTRO-OPTIC DEVICE AND ELECTRONIC DEVICE

BACKGROUND

1. Technical Field

The present invention relates to a technical field of electro-optic devices such as a liquid crystal device, and electronic devices such as a liquid crystal projector provided with the electro-optic device.

2. Related Art

This type of electro-optic device includes, on a substrate, pixel electrodes, scanning lines for selectively driving the pixel electrodes, data lines, and TFTs (Thin Film Transistors) for pixel switching, and performs active matrix driving, for example.

In the above-described electro-optic device, an inspection circuit may be arranged on the substrate, so that defects of various types of elements configuring the device can be inspected in the manufacturing process. For instance, Japanese Patent No. 2516197 discloses a technique in which TFTs are inspected by applying an inspection voltage having a time-varying voltage level between source electrodes and pixel electrodes.

Japanese Patent No. 2516197 is an example of related art.

According to researches made by the inventor of the present application, a proposal is made for arranging two data lines to each column of pixel electrodes, for example, and ensuring a write time to each pixel in order to realize a high quality image display in an electro-optic device. However, if the above-described technique of Japanese Patent No. 2516197 is applied as is to such a device, a device configuration thereof becomes complicated and the manufacturing cost also increases. Furthermore, normal inspection may not be carried out. In other words, the above-described technique has a technical problem that its application is difficult to a device in which the device configuration is partially changed.

SUMMARY

An advantage of some aspects of the invention is to provide a highly reliable electro-optic device and electronic device capable of displaying a high quality image.

An electro-optic device according to an aspect of the invention includes a plurality of pixel electrodes arrayed along a first direction and a second direction intersecting the first direction; a data line block for providing an image signal to each of a first pixel electrode group and a second pixel electrode group in one column of the plurality of pixel electrodes arrayed in a line in the first direction, the data line block being configured by a plurality of data line pairs in which a pair of a first data line and a second data line extending in the first direction is arranged for each column; an image signal supplying unit for sequentially providing an image signal in time-series to each of the data line pairs configuring the data line block from one end of each of the plurality of data line pairs; and an inspection voltage supplying unit for supplying an inspection voltage from another end of each of the plurality of data line pairs each to the data line block and separately to each of the first data line and the second data line.

In the electro-optic device according to the aspect of the invention, wirings such as scanning lines and data lines as well as electronic elements such as transistors for pixel switching are stacked as necessary on a substrate, for example, while being insulated from each other by insulating films, to configure a circuit for driving the pixel electrodes, and the plurality of pixel electrodes arrayed along the first direction and the second direction intersecting the first direction (i.e., arrayed in a matrix form) are provided on the upper layer side thereof.

At the time of an operation of the electro-optic device of the invention, for example, a switching operation of a TFT for pixel switching electrically connected to the pixel electrode is controlled through the scanning line, and an image signal is provided through the data line arranged along the first direction, so that a voltage corresponding to the image signal is applied to the pixel electrode through the TFT. Image display in an image display region in which the plurality of pixel electrodes are arrayed is thereby realized.

According to the aspect of the invention, the data line for providing the image signal to each pixel includes the data line pair for providing the image signal to each of the first pixel electrode group and the second pixel electrode group in one column of the plurality of pixel electrodes arrayed in a line in the first direction. In other words, according to the aspect of the invention, two data lines are provided for one column of pixel electrodes. The data line pair is configured by the first data line for providing the image signal to the first pixel electrode group, and the second data line for providing an image signal to the second pixel electrode group. With such a configuration, images based on different image signals can be simultaneously displayed in each of the first pixel electrode group and the second pixel electrode group, for example. As a result, different image signals can be simultaneously provided to the plurality of pixels even if the number of pixels in the image display region is increased. The writing time for one pixel thus can be sufficiently ensured.

The first data line and the second data line described above are arranged so as to at least partially overlap each other, for example, when seen from above the substrate in plan view. Since the first data line and the second data line are often made of a non-transparent material such as aluminum, for example, a ratio of a non-aperture region in the image display region can be reduced by arranging the first data line and the second data line so as to overlap each other. In other words, the ratio (i.e., aperture ratio) of an aperture region in the image display region can be enhanced.

The data lines according to the aspect of the invention configure the data line block including the plurality of data line pairs (i.e., the pairs of first data lines and second data lines), and the image signal for displaying an image is provided each to the data line block by the image signal supplying unit from one end of each of the plurality of data line pairs. In other words, the image signals are collectively provided to the plurality of data line pairs in one data line block. The image signal supplying unit sequentially provides the image signals in time-series to the plurality of data line blocks.

In the electro-optic device according to the aspect of the invention, defects of the TFTs and the like can be inspected by supplying an inspection voltage by the inspection voltage supplying unit from the other end of each of the plurality of data line pairs. According to the inspection voltage supplying unit of the aspect of the invention, the inspection voltage is supplied to each data line block, and the inspection voltage is separately supplied to each of the first data lines and the second data lines.

Specifically, the inspection voltage is first supplied to each of the first data lines contained in one data line block, for example. Then, the inspection voltage is supplied to each of the second data lines contained in one data line block. The inspection voltage is thus supplied separately to the first data line and the second data line even if these data lines are contained in the same data line block. After the supply of the inspection voltage to one data line block is completed, the inspection voltage is similarly supplied in the order of the first data lines contained in another data line block and the second data lines contained in the other data line block.

According to the inspection voltage supplying unit described above, the inspection can be suitably carried out even if two data lines are provided to one column of pixels as in the electro-optic device according to the aspect of the invention. More specifically, complication in the configuration of the inspection voltage supplying unit and increase in cost can be prevented even with the device configuration in which the image signal is provided to each data line block including the plurality of data line pairs, as described above.

As described above, according to the electro-optic device of the aspect of the invention, high quality image display is possible and high reliability can be realized.

According to another aspect of the invention, the inspection voltage supplying unit includes a control signal supply unit for providing a first control signal and a second control signal, and the inspection voltage supplying unit supplies the inspection voltage to the first data line based on the first control signal, and supplies the inspection voltage to the second data line based on the second control signal.

According to this aspect, the first control signal and the second control signal are respectively provided from the control signal supplying unit to the inspection voltage supplying unit when inspecting the device. The first control signal and the second control signal each control a timing at which the inspection voltage supplying unit supplies the inspection voltage, and the inspection voltage supplying unit supplies the inspection voltage to the first data line based on the first control signal and supplies the inspection voltage to the second data line based on the second control signal.

More specifically, the inspection voltage supplying unit supplies the inspection voltage to the first data line, for example, when the first control signal is at an H level and the second control signal is at an L level. On the other hand, the inspection voltage supplying unit supplies the inspection voltage to the second data line when the first control signal is at the L level and the second control signal is at the H level.

The inspection voltage can be very easily supplied separately to each of the first data line and the second data line by using the first control signal and the second control signal. Therefore, the inspection of the device by the inspection voltage can be very suitably carried out.

In the aspect including the control signal supplying unit described above, the second control signal may be an inverted signal obtained by inverting a phase of the first control signal.

Thus, for example, when the first control signal is at the H level, the second control signal is at the L level different from that of the first control signal. Similarly, when the first control signal is at the L level, the second control signal is at the H level different from that of the first control signal. The inspection voltage thus can be very easily supplied separately to each of the first data line and the second data line. Therefore, the inspection of the device by the inspection voltage can be very suitably carried out.

In the electro-optic device according to a still another aspect of the invention, the inspection voltage supplying unit includes a shift register.

According to this aspect, the inspection voltage supplying unit can easily and reliably supply the inspection voltage to each data line block by the shift register. In other words, the inspection voltage can be more suitably supplied to the data line block that should be supplied with the inspection voltage. Therefore, the inspection of the device by the inspection voltage can be very suitably carried out.

An electronic device according to an aspect of the invention includes the electro-optic device according to any one of the aspects of the invention described above.

According to the electronic device of the aspect of the invention, various types of electronic devices such as a projection display device, a television, a portable telephone, an electronic notebook, a word processor, a video tape recorder of a view finder type or of a monitor direct viewing type, a work station, a television (TV) telephone, a POS terminal, a device with a touch panel, and the like, capable of displaying high quality images and having a high reliability can be realized since the electro-optic device according to any one of the aspects of the invention described above is provided. An electrophoretic device such as an electronic paper can also be realized as the electronic device according to the aspect of the invention.

The effects and other advantages of the invention should become apparent from the description of exemplary embodiments to be described below.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described below with reference to the drawings.

Electro-Optic Device

An electro-optic device according to this embodiment will be described with reference to FIGS. 1 to 12. In the following embodiment, a liquid crystal device of a TFT active matrix driving method incorporating a drive circuit will be described as an example of the electro-optic device in accordance with the embodiment of the invention.

Figure 1:
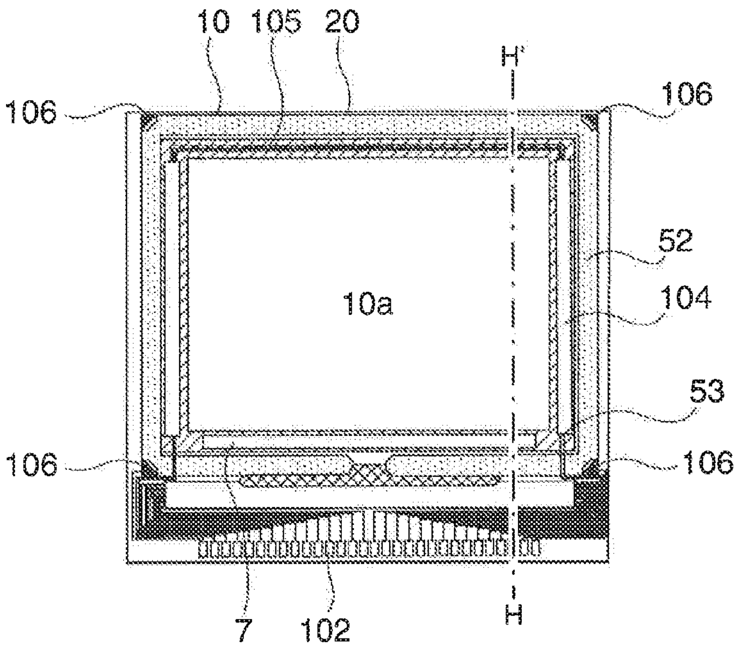
FIG. 1 is a plan view showing an overall configuration of an electro-optic device according to an embodiment.

An overall configuration of the electro-optic device according to this embodiment will be described with reference to FIGS. 1 and 2. FIG. 1 is a plan view showing the overall configuration of the electro-optic device according to this embodiment, and FIG. 2 is a cross-sectional view taken along line H-H' of FIG. 1.

Figure 2:
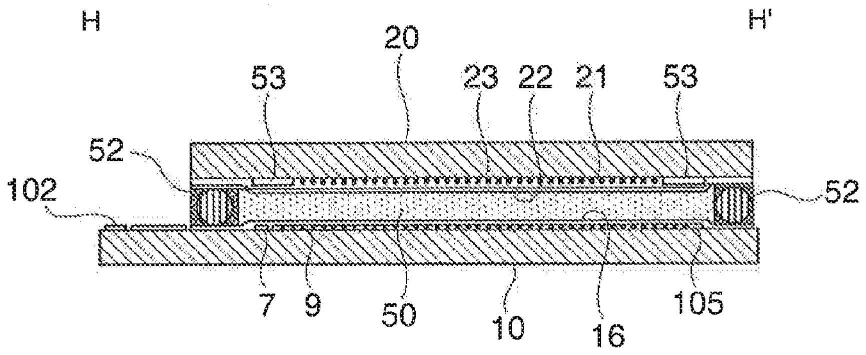
FIG. 2 is a cross-sectional view taken along line H-H' of FIG. 1.

In FIGS. 1 and 2, a TFT array substrate 10 and a counter substrate 20 are arranged to face each other in the electro-optic device according to this embodiment. The TFT array substrate 10 is a transparent substrate such as a quartz substrate or a glass substrate, a silicon substrate, or the like. The counter substrate 20 is a transparent substrate such as a quartz substrate or a glass substrate. A liquid crystal layer 50 is enclosed between the TFT array substrate 10 and the counter substrate 20. The liquid crystal layer 50 includes liquid crystals mixed with one type or several types of nematic liquid crystals, for example, and takes a predetermined alignment state between a pair of alignment films.

The TFT array substrate 10 and the counter substrate 20 are bonded to each other by a seal material 52 arranged in a seal region positioned at a periphery of an image display region 10*a* in which a plurality of pixel electrodes is arranged.

The seal material 52 may be an ultraviolet curing resin, a thermal curing resin, or the like for bonding the substrates together, for example, and is cured by ultraviolet irradiation, heating, or the like after being applied on the TFT array substrate 10 in the manufacturing process. A gap material such as glass fiber or glass beads for providing a spacing (i.e., an inter-substrate gap) between the TFT array substrate 10 and the counter substrate 20 at a predetermined value is dispersed in the seal material 52. The gap material may be arranged in the image display region 10*a* or a peripheral region positioned at the periphery of the image display region 10*a* in addition to or in place of those mixed to the seal material 52.

A frame light shielding film 53 having a light shielding property for defining a frame region of the image display region 10*a* is arranged on the counter substrate 20 side in parallel to an inner side of the seal region where the seal material 52 is arranged. One part of or all of the frame light shielding film 53 may be arranged as a built-in light shielding film on the TFT array substrate 10 side.

A demultiplexer 7, a scanning line drive circuit 104, an external circuit connection terminal 102, and the like are respectively formed at the periphery of the image display region 10*a* on the TFT array substrate 10.

The demultiplexer 7 is arranged on the inner side of the seal material 52 as viewed from above the TFT array substrate 10 in plan view along one side of the image display region 10*a* that lies along one side of the TFT array substrate 10 and in a manner to be covered with the frame light shielding film 53. The demultiplexer 7 serves as an example of an "image signal supplying unit" of the embodiment of the invention.

The scanning line drive circuit 104 is provided along two sides adjacent to the above one side and in a manner to be covered with the frame light shielding film 53. Furthermore, a plurality of wirings 105 are provided along the remaining one side of the TFT array substrate 10 in a manner to be covered with the frame light shielding film 53 in order to connect the two scanning line drive circuits 104 arranged on both sides of the image display region 10*a*.

Upper and lower conduction terminals 106 for connecting the substrates by upper and lower conduction materials are arranged in regions facing four corners of the counter substrate 20 on the TFT array substrate 10. These terminals allow the TFT array substrate 10 and the counter substrate 20 to be electrically conducted with each other.

In FIG. 2, a stacked structure, in which TFTs for pixel switching, serving as drive elements, and wirings such as scanning lines and data lines are incorporated, is formed on the TFT array substrate 10. The illustration on a detailed configuration of the stacked structure is not provided in FIG. 2, but pixel electrodes 9 each made of a transparent material such as ITO (Indium Tin Oxide) are formed in island shapes into a predetermined pattern for respective pixels on the stacked structure.

The pixel electrodes 9 are formed in the image display region 10*a* on the TFT array substrate 10 in a manner to face counter electrodes 21. An alignment film 16 is formed in a manner to cover the pixel electrodes 9 on a surface, facing the liquid crystal layer 50, of the TFT array substrate 10, that is, on the pixel electrodes 9.

A light shielding film 23 is formed on a surface, opposing the TFT array substrate 10, of the counter substrate 20. The light shielding film 23 is formed in a lattice shape, for example, as viewed from above the opposing surface of the counter substrate 20 in plan view. In the counter substrate 20, non-aperture regions are defined by the light shielding film 23, and regions partitioned by the light shielding film 23 become aperture regions that transmit light emitted from a projector lamp or a direct view backlight, for example. The light shielding film 23 may be formed in a stripe shape, and the non-aperture regions may be defined by the light shielding film 23 and various constituent elements such as the data lines arranged on the TFT array substrate 10 side.

The counter electrode 21 made of a transparent material such as ITO is formed in a manner to face the plurality of pixel electrodes 9 on the light shielding film 23. Furthermore, a color filter (not shown in FIG. 2) may be formed on the light shielding film 23 in a region including portions of the aperture regions and the non-aperture regions to enable color display in the image display region 10*a*. An alignment film 22 is formed on the counter electrode 21 on the opposing surface of the counter substrate 20.

Although the illustration is not provided here, an inspection circuit for inspecting quality, defects, and the like of the electro-optic device during the manufacturing process or in time of shipment is provided on the TFT array substrate 10 shown in FIGS. 1 and 2, in addition to the above-mentioned demultiplexer 7 and the drive circuits such as the scanning line drive circuit 104. The inspection circuit will be described in detail later.

Figure 3:
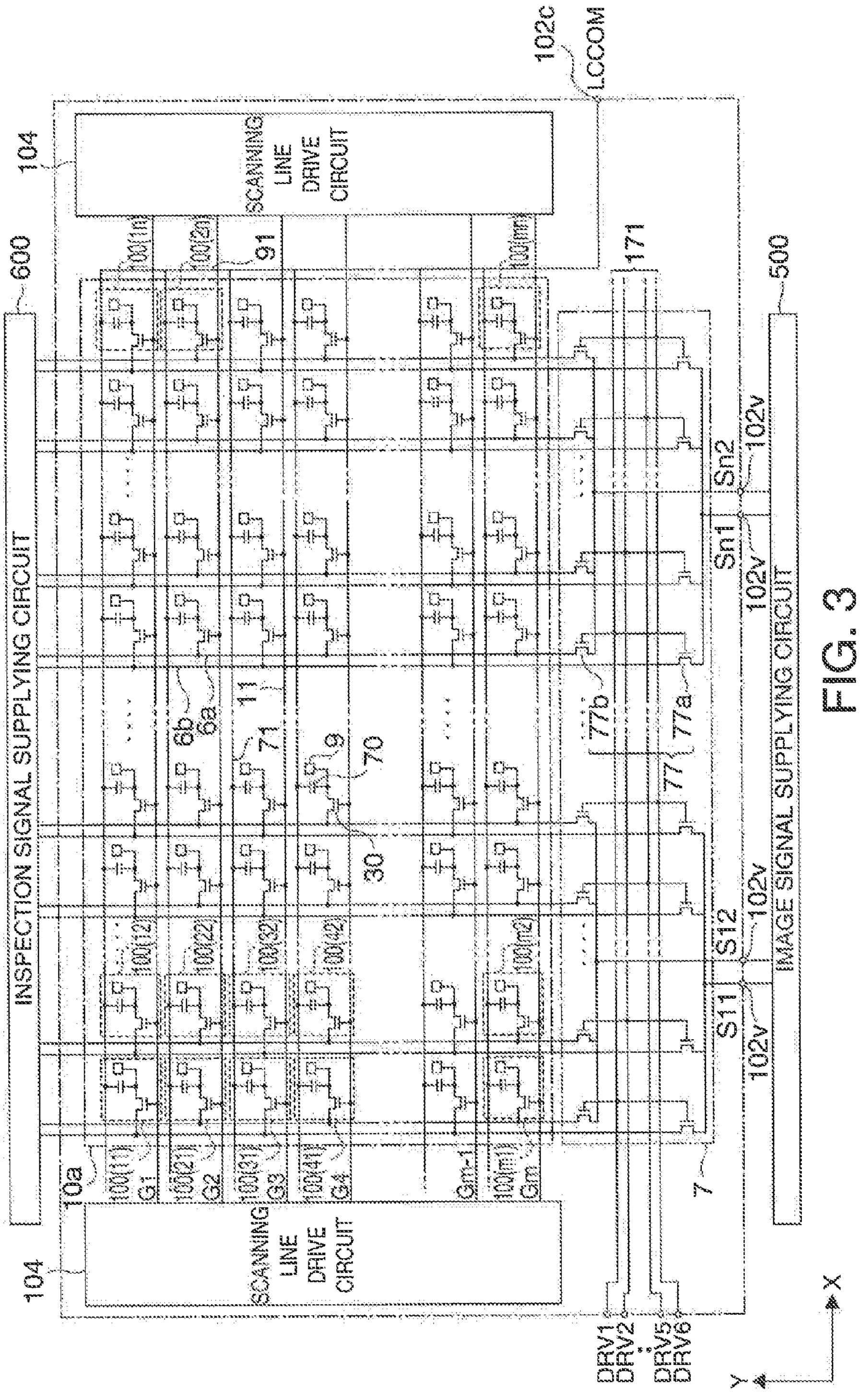
FIG. 3 is an equivalent circuit diagram showing an electrical configuration of the electro-optic device according to the embodiment.

An electrical configuration of the electro-optic device according to this embodiment will be described below with reference to FIG. 3. FIG. 3 is an equivalent circuit diagram showing an electrical configuration of the electro-optic device according to this embodiment.

In FIG. 3, the electro-optic device according to this embodiment includes the demultiplexer 7, the scanning line drive circuits 104, and drive signal lines 171 on the TFT array substrate 10. An image signal supplying circuit 500 serving as an external circuit is electrically connected to image signal terminals 102*v* among the external circuit connection terminals 102 on the TFT array substrate 10.

The scanning line drive circuit 104 includes a shift register, and provides a scan signal Gi (i=1, . . . , m) to scanning lines 11. More specifically, the scanning line drive circuit 104 selects m scanning lines 11 in a predetermined order described below, and sets the scan signal to the selected scanning lines 11 at an H level, which corresponds to a selection voltage, and the scan signal to other scanning lines at an L level, which corresponds to a non-selection voltage.

The image signal supplying circuit 500 is configured separately from the TFT array substrate 10, and is electrically connected to the TFT array substrate 10 by way of the image signal terminals 102*v* at the time of display operation. The image signal supplying circuit 500 outputs, to pixel electrodes 9 corresponding to the scanning lines 11 selected by the scanning line drive circuit 104 and the data lines 6 selected by the demultiplexer 7, an image signal having a voltage corresponding to a tone of pixels that include the pixel electrodes.

The data lines 6 are formed extending along a Y direction in the image display region 10*a*. The data lines 6 include n (n is a natural number of 2 or greater) upper layer data lines 6*a* and lower layer data lines 6*b*. The upper layer data line 6*a* is arranged to overlap the lower layer data line 6*b* when seen from above the TFT array substrate 10 in plan view. In particular, the upper layer data line 6*a* is an example of a "first data line" in the embodiment of the invention, and the lower layer data line 6*b* is an example of a "second data line" in the embodiment of the invention. When simply referred to as the "data lines 6" in the following description, the data lines 6 indicate both the upper layer data line 6*a* and the lower layer data line 6*b*.

An image data signal Sij is provided from the image signal supplying circuit 500 to the data lines 6 through the demultiplexer 7. The demultiplexer 7 is configured with a plurality of transistors 77. The transistors 77 include upper layer transistors 77*a* corresponding to the upper layer data lines 6*a*, and lower layer transistors 77*b* corresponding to the lower layer data lines 6*b*.

The drive signal lines 171 are connected to gate electrodes of the transistors 77, so that the transistors 77 can be driven at certain timings based on drive signals DRV provided from the drive signal lines 171.

The gate electrodes of the pair of transistors 77 connected to the pair of data lines 6 the upper layer data line 6*a* and the lower layer data line 6*b*), which overlap each other as viewed from above the TFT array substrate 10 in plan view, are electrically connected to one common drive signal line 171. Thus, the pair of transistors is driven at the same timing.

Six drive signal lines 171 are respectively connected to the gate electrodes of six pairs of transistors 77. For instance, the six pairs of transistors 77 can be sequentially driven one pair at a time by providing drive signals in order from the upper side of the six drive signal lines 171.

Thus, the corresponding image data signals Sij are respectively provided from the image signal supplying circuit 500 to the upper layer data line 6*a* and the lower layer data line 6*b* in synchronization with the timing at which the transistors 77 are driven. Specifically, an image data signal Si1 corresponding to the upper layer data line 6*a* and an image data signal Si2 corresponding to the lower layer data line 6*b*, which are different from each other, are respectively provided from the image signal supplying circuit 500 to the pixels to which the upper layer data line 6*a* and the lower layer data line 6*b* are connected.

From the scanning line drive circuit 104, m (m is a natural of 2 or greater) scanning lines 11 extend in an X direction. Each of the scanning lines 11 is electrically connected to the gate electrodes of TFTs 30, and can drive the TFTs 30 arranged on the scanning line 11 based on the supply timing of the scan signal. Source regions of the TFTs 30 whose gate electrodes are connected to the scanning lines 11 in odd rows are electrically connected to the upper layer data lines 6*a*. On the other hand, source regions of the TFTs 30 whose gate electrodes are connected to the scanning lines 11 in even rows are electrically connected to the lower layer data lines 6*b*.

In the image display region 10*a*, the pixels are arrayed in a matrix form in correspondence with intersections of the data lines 6 and the scanning lines 11. One pixel is made up of the counter electrode 20 and the pixel electrode 9 (see FIG. 2), which form a liquid crystal element with the liquid crystal layer 50 held between them, the TFT 30 for pixel switching, and a storage capacitor 70.

The gate electrode of the TFT 30 is electrically connected to the scanning line 11, so that the TFT 30 is switch-controlled according to the scan signal. When the TFT 30 is turned ON, the image data signal Sij provided to the source region electrically connected to the data line 6 is provided to the pixel electrode 9 through the drain region of the TFT 30.

One of the electrodes of the storage capacitor 70 is electrically connected to a common potential line 91. The common potential line 91 extends to the peripheral region and connects to a connection terminal 102*c*. The connection terminal 102*c* is one part of the external connection terminal 102 (see FIG. 1). The connection terminal 102*c* is held at a LCCOM voltage by a power supply circuit, which is built in an external device connected to the external connection terminal 102, for outputting the LCCOM voltage.

In this embodiment, the image data signal is received by connecting the image signal supplying circuit 500 serving as an external circuit to the image signal terminals 102*v*, which are some of the external connection terminals 102, but a data signal supplying circuit for outputting the image data signal may also be formed on the TFT array substrate 10. In other words, the image signal supplying circuit 500 may be incorporated as a data signal supplying circuit inside the liquid crystal device.

In the electro-optic device according to this embodiment, an inspection signal supplying circuit 600 for providing an inspection signal is arranged on a side opposite (i.e., the upper side in FIG. 3) to the side of the data line 6 to which the image signal is provided. The inspection signal supplying circuit 600 is an example of an "inspection signal supplying unit" according to the embodiment of the invention, and is electrically connected respectively to the upper layer data lines 6*a* and the lower layer data lines 6*b*. The specific configuration and an operation of the inspection signal supplying circuit 600 will be described in detail later.

Figures 4A, 4B, 4C:
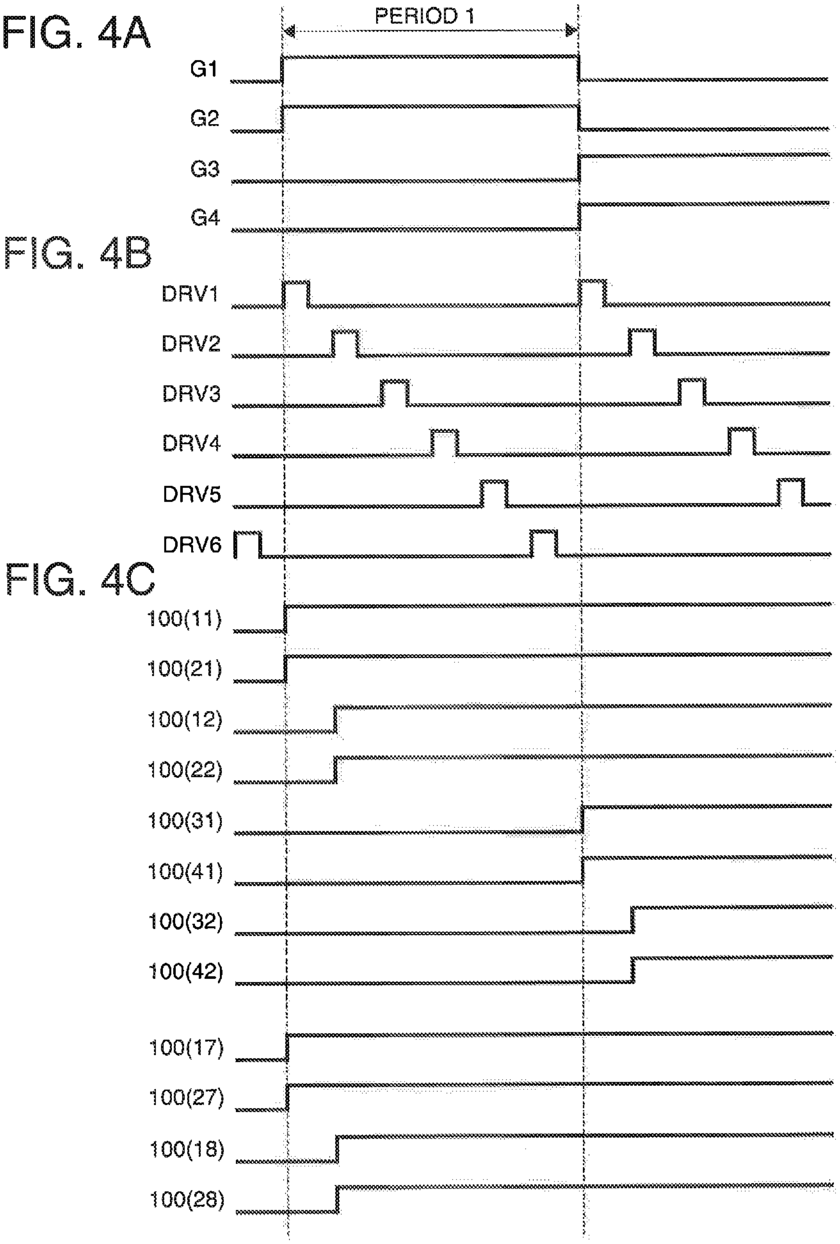
FIGS. 4A to 4C are timing charts each showing input/output timings of various types of control signals input and output inside the electro-optic device according to the embodiment.

Various types of control signals to be input and output inside the electro-optic device according to this embodiment will be specifically described with reference to FIGS. 4A to 4C in addition to FIG. 3. FIGS. 4A to 4C are timing charts each showing input/output timings of various types of control signals to be input and output inside the electro-optic device according to this embodiment.

First, a supply timing of a scan signal Gm provided from the scanning line drive circuit 104 to each pixel through the corresponding scanning line 11 will be described with reference to FIG. 4A.

The scan signals Gm are provided at the same timing to the two scanning lines 11 adjacent to each other out of the m scanning lines 11. That is, the pixels arranged on the two consecutive scanning lines 11 are respectively driven at the same timing. Specifically, scan signals G1 and G2, G3 and G4, . . . , Gm−1 and Gm are applied in this order in a pulse form at predetermined timings from the scanning lines 11.

The timing at which the drive signals DRV are provided from the drive signal lines 171 to the transistors 77 of the demultiplexer 7 and the potential to be written to each of the pixels arrayed in the image display region 10*a* will be described with reference to FIGS. 4B and 4C.

While the scan signals G1 and G2 are being provided to the scanning lines 11 (see a period 1 in FIGS. 4A to 4C), the drive signals DRV1, DRV2, . . . , DRV6 are sequentially provided to the six drive signal lines 171.

As shown in FIG. 3, when the drive signal DRV1 is provided, the transistors 77 corresponding to pixels 100(11) and 100(21) are driven, so that the pixels 100(11) and 100(21) are brought into a writable state. Furthermore, since the drive signal DRV1 is also simultaneously provided to the transistors 77 corresponding to the pixels belonging to another data line group such as pixels 100(17) and 100(27), these pixels are also brought into a writable state.

When the drive signal DRV2 is subsequently provided, the transistors 77 corresponding to pixels 100(12) and 100(22) are driven, so that the pixels 100(12) and 100(22) are brought into a writable state. Furthermore, since the drive signal DRV2 is also simultaneously provided to the transistors 77 corresponding to the pixels belonging to another data line group such as pixels 100(18) and 100(28), these pixels are also brought into a writable state. The image data signal Sij provided from the data line drive circuit is applied to the pixels in the writable state. When writing is completed to all the pixels in the image display region 10*a*, the above-described operation is repeated again to thereby update the display image for each field. The image data signal Sij written to the pixel is held until writing is again carried out in the next field.

Figure 5:
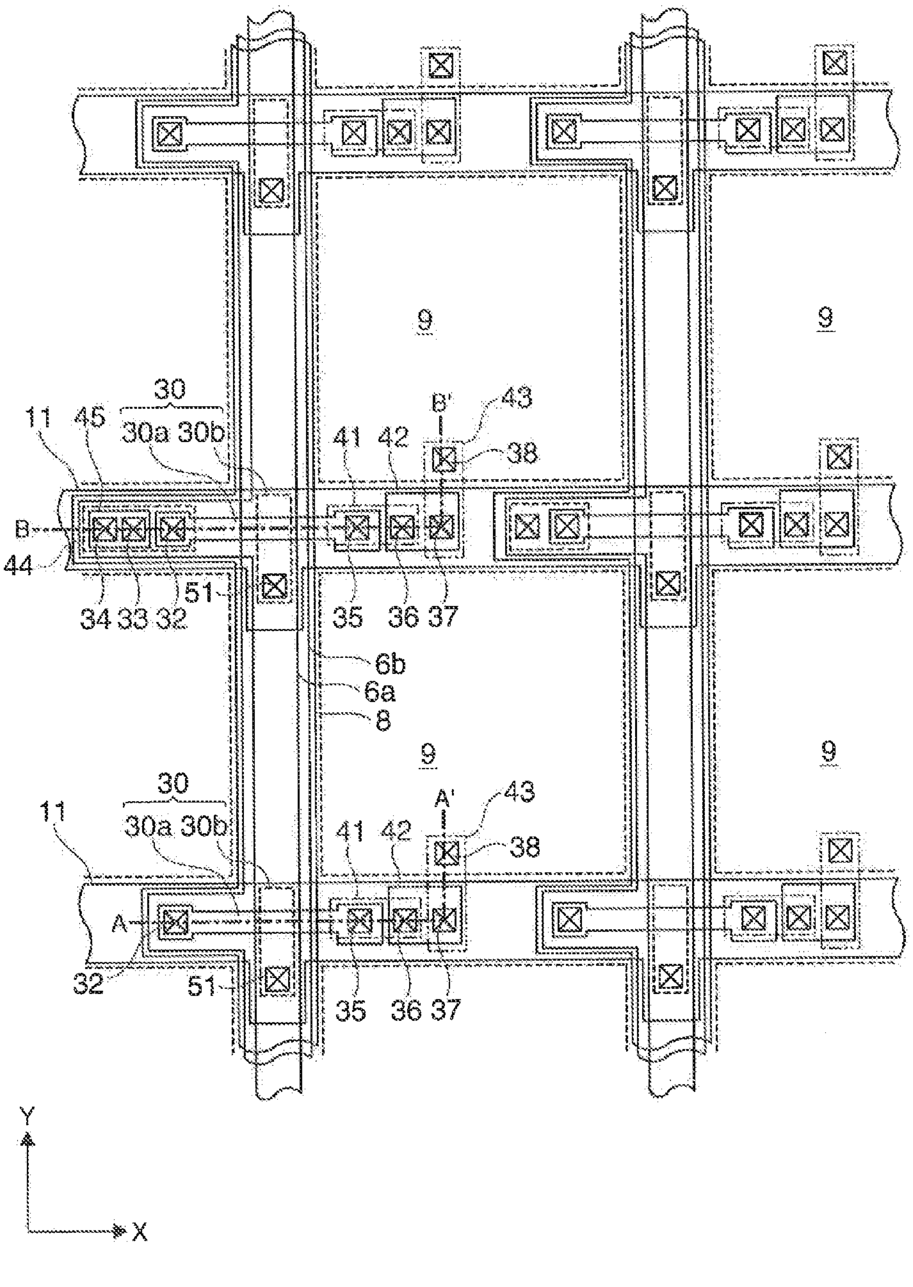
FIG. 5 is a schematic diagram transparently showing positional relationships among electrodes, wirings, and the like arranged in an image display region of the electro-optic device according to the embodiment.
Figure 6:
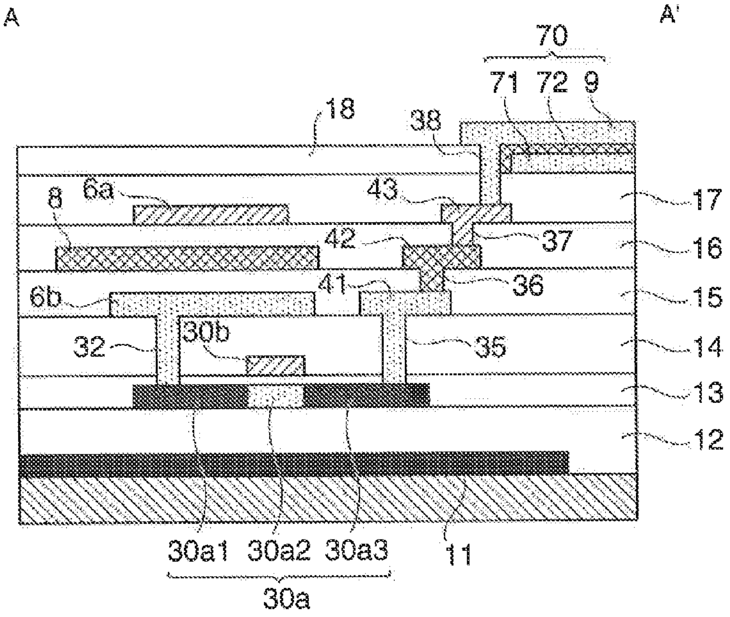
FIG. 6 is a cross-sectional view taken along line A-A' of FIG. 5.
Figure 7:
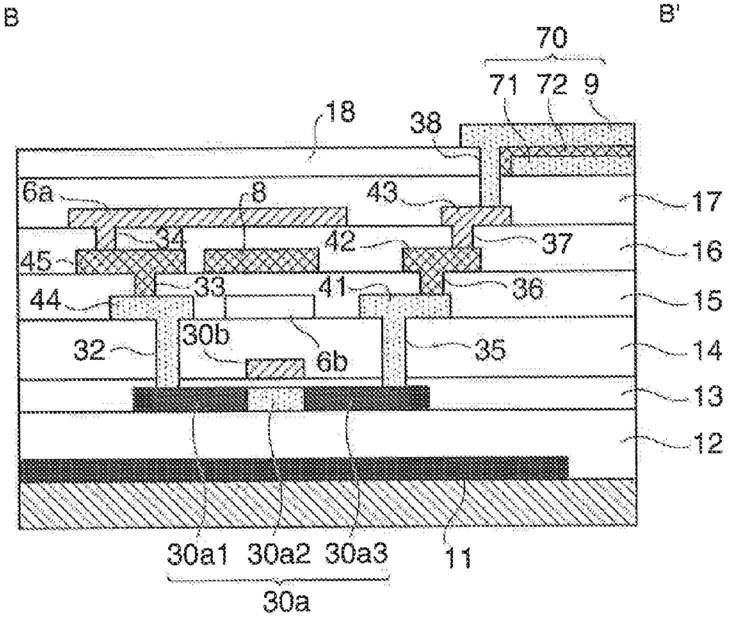
FIG. 7 is a cross-sectional view taken along line B-B' of FIG. 5.

The stacked structure formed on the TFT array substrate 10 in the electro-optic device according to this embodiment will be described in detail below with reference to FIGS. 5 to 7. FIG. 5 is a schematic diagram transparently showing positional relationships among electrodes, wirings, and the like arranged to carry out the electro-optic operation in the image display region 10*a* of the electro-optic device according to this embodiment. FIGS. 6 and 7 are cross-sectional views taken along line A-A' and line B-B' of FIG. 5, respectively. In each of FIGS. 5 to 7, the scale is differed for each layer and each member so that each layer and each member has a recognizable size on the figure. Illustration of the structure shown in each of FIGS. 5 to 7 partially omits some portions thereof to facilitate understanding of the illustrated contents.

For supplemental description, FIG. 6 is a cross-sectional view showing a stacked structure of the pixel (i.e., a pixel where the TFT 30 is connected to the lower layer data line 6*b*) corresponding to the scanning line 11 in an odd row among the m scanning lines 11 in FIG. 3. FIG. 7 is a cross-sectional view showing a stacked structure of the pixel (i.e., a pixel where the TFT 30 is connected to the upper layer data line 6*a*) corresponding to the scanning line 11 in an even row among the m scanning lines 11 in FIG. 3.

First, the stacked structure of the pixel corresponding to the scanning line 11 in an odd row among the m scanning lines 11 will be described with reference to FIGS. 5 and 6.

The scanning lines 11 are formed on the TFT array substrate 10. The scanning lines 11 are each formed to extend in an X direction as viewed from above the TFT array substrate 10 in plan view. The scanning line 11 is made of a conductive material having a light shielding property such as W (tungsten), Ti (titanium), and TiN (titanium nitride), and shields light coming from the back side (i.e., the lower side in FIG. 5) of the TFT array substrate 10 to thereby prevent the wirings, the elements, and the like formed on the upper layer side of the scanning line 11 from being exposed to the light.

In this embodiment, the scanning line 11 is formed to have a width larger than that of the forming region of the TFT 30 as viewed from above the TFT array substrate 10 in plan view to suppress the retention property of the TFT from lowering due to a leakage current that may be generated when the semiconductor layer of the TFT 30 is exposed to light. Therefore, by forming the scanning line 11 to be wider, the semiconductor layer of the TFT 30 can be mostly or completely light-shielded from back surface reflection on the TFT array substrate 10 and returning light such as light emitted from another electro-optic device and passed through a synthetic optical system in a multi-plate projector or the like. As a result, the light leakage current generated at the time of the operation of the electro-optic device is reduced. Therefore, a contrast ratio of the display image can be enhanced, and high quality image display can be achieved.

The TFT 30 is formed on the upper layer side of the scanning line 11 with a first inter-layer insulating film 12 interposed therebetween. The TFT 30 is arranged for each pixel in a manner to correspond to each of the intersections of the scanning lines 11 formed to extend in the X direction and the data lines 6 formed to extend in a Y direction as viewed from above the TFT array substrate 10 in plan view.

The TFT 30 is configured by a semiconductor layer 30*a* and a gate electrode 30*b* arranged on the upper layer side with a gate insulating film 13 interposed therebetween. The semiconductor layer 30*a* is configured by a source region 30*a*1, a channel region 30*a*2, and a drain region 30*a*3 (see FIG. 6). An LDD (Lightly Doped Drain) region may be formed at an interface between the channel region 30*a*2 and the source region 30*a*1 or between the channel region 30*a*2 and the drain region 30*a*3.

The gate electrode 30*b* is formed to face the channel region 30*a*2 on the upper layer side of the semiconductor layer 30*a* with the gate insulating film 13 interposed therebetween. The gate electrode 30*b* is electrically connected to the scanning line 11 through a contact hole 51 formed in the inter-layer insulating film 12 and the gate insulating film 13 (see FIG. 5).

The source region 30*a*1 is electrically connected to the lower layer data line 6*b* formed on the upper layer side of the source region 30*a* through a contact hole 32 formed in the gate insulating film 13 and a second inter-layer insulating film 14. The lower layer data line 6*b* is made of a conductive material having a light shielding property such as Al (aluminum), and shields light coming from a front side (i.e., the upper side in FIG. 5) of the TFT array substrate 10 to prevent the wirings, the elements, and the like formed on the lower layer side of the lower layer data line 6*b* from being exposed to the light. As a result, the TFT 30 can be mostly or completely light-shielded from the back surface reflection on the TFT array substrate 10 and the returning light such as light emitted from another electro-optic device and passed through a synthetic optical system in a multi-plate projector or the like, and high quality image display can be achieved.

The drain region 30*a*3 is electrically connected to a first relay layer 41 through a contact hole 35 formed in the gate insulating film 13 and the second inter-layer insulating film 14. The first relay layer 41 is formed in the same layer as the lower layer data line 6*b*. The first relay layer 41 is made of the same type of material as the lower layer data line 6*b*, and is formed in the same layer as the lower layer data line 6*b* by patterning a conductive layer formed flatly on the second inter-layer insulating film 14, for example.

A second relay layer 42 is formed on the upper layer side of the first relay layer 41, and is electrically connected to the first relay layer 41 through a contact hole 36 formed in a third inter-layer insulating film 15.

A third relay layer 43 is formed further on the upper layer side of the second relay layer 42, and is electrically connected to the second relay layer 42 through a contact hole 37 formed in a fourth inter-layer insulating film 16.

The pixel electrode 9 is formed on the upper layer side of the third relay layer 43, and is electrically connected to the third relay layer 43 through a contact hole 38 formed in a fifth inter-layer insulating film 17 and a sixth inter-layer insulating film 18. Thus, the pixel electrode 9 is electrically connected to the drain region 30*a*3 of the TFT 30 by way of the first relay layer 41, the second relay layer 42, and the third relay layer 43. As a result, the image signal is provided to the pixel electrode 9 at the timing at which the TFT 30 is turned ON.

A capacitive electrode 71 is formed on the lower layer side of the pixel electrode 9 with a capacitive insulating film 72 interposed therebetween. In other words, the pixel electrode 9 and the capacitive electrode 71 sandwich the capacitive insulating film 72 to thereby form the storage capacitor 70.

In accordance with an aspect of the embodiment, the pixel electrode 9 and the capacitive electrode 71 are both made of ITO. The capacitive electrode can be widely formed in the open region since ITO is a transparent conductive material, whereby the storage capacitor 70 having a large capacitance value can be formed.

Figure 8:
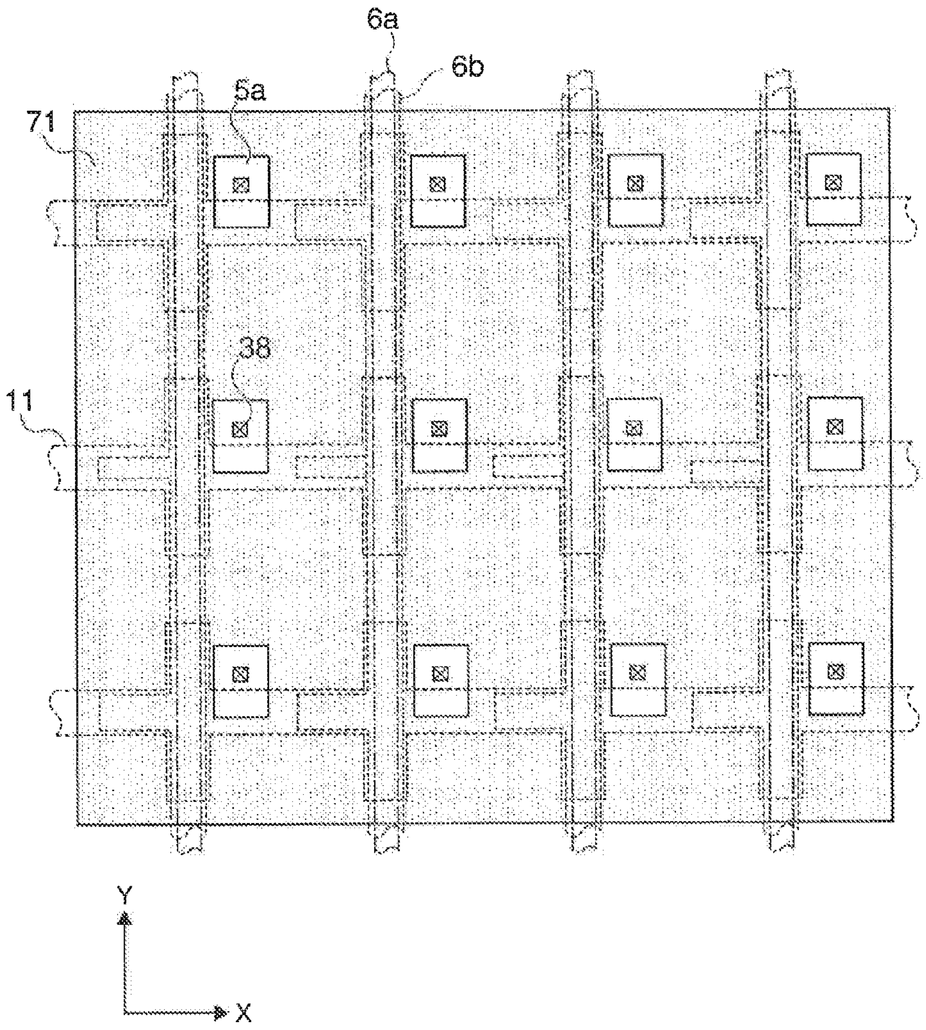
FIG. 8 is a schematic diagram showing a region where a capacitive electrode is arranged on a TFT array substrate along with data lines and scanning lines.

FIG. 8 is a schematic diagram showing a region where the capacitive electrode 71 is arranged on the TFT array substrate 10 along with the data lines 6 and the scanning lines 11. In FIG. 8, the data lines 6 and the scanning lines 11 formed on the lower layer side of the capacitive electrode 71 are transparently shown for the sake of convenience for the illustration, and the scale is differed for each layer and each member so that each layer and each member has a recognizable size on the figure.

The data lines 6 and the scanning lines 11 extend in the Y direction and the X direction, respectively. Each pixel is partitioned by the data line 6 and the scanning line 11. The capacitive electrode 71 includes an aperture region 5*a* for each pixel, and the aperture region 5*a* is formed so that the contact hole 38 is positioned on an inner side thereof. Since the aperture region 5*a* is formed wider than the contact hole 38, the pixel electrode 9 and the third relay layer 43 can be safely connected to each other without short circuiting to the capacitive electrode 71 even if the pixel electrode 9 and the third relay layer 43 are electrically connected to each other through the contact hole 38.

As described above, the capacitive electrode 71 can be formed over a wider range of the image display region as shown in FIG. 8 since it is made of ITO that is a transparent conductive material. As a result, the storage capacitor 70 having a relatively large capacitance value can be formed, and the holding property of the pixel can be enhanced.

Furthermore, in this embodiment, the stacked structure near the TFT array substrate 10 tends to become complicated as the data line 6 has the double layered structure. In such a case, the storage capacitor 70 can be readily added by forming the storage capacitor 70 on the pixel electrode 9 side where the stacked structure is relatively simple. In particular, complication of the stacked structure can be effectively suppressed by using the pixel electrode 9 as one of the electrodes of the storage capacitor 70.

A shield layer 8 is formed on the upper layer side of the lower layer data line 6*b* with the third inter-layer insulating film 15 interposed therebetween. The shield layer 8 is formed to suppress or prevent coupling between the lower layer data line 6*b* and the upper layer data line 6*a* formed above the shield layer 8 with the fourth inter-layer insulating film 16 interposed therebetween (i.e., disturbance of respectively applied image signals by an electric field generated due to a potential difference between the upper layer data line 6*a* and the lower layer data line 6*b*).

As shown in FIG. 5, the shield layer 8 is formed to have a width larger than the data line 6 in the non-aperture region excluding the intersecting regions where the data lines 6 and the scanning lines 11 intersect each other. The electric field generated between the upper layer data line 6*a* and the lower layer data line 6*b* more or less has components in a plane direction parallel to the TFT array substrate 10, and some of such components go around an end of the shield layer 8. Even in such a case, the electric field that goes around an outer side of the end can be effectively reduced by forming the shield layer 8 sufficiently larger than the upper layer data line 6*a* and the lower layer data line 6*b*.

Meanwhile, the upper layer data line 6*a* is not electrically connected at all to the pixels corresponding to the scanning lines 11 in odd rows among the m scanning lines 11.

The stacked structure for the pixels corresponding to the scanning lines 11 in even rows among the m scanning lines 11 will be described below with reference to FIGS. 5 and 7. The description on the wirings, elements, and the like common with those in the stacked structure for the pixels corresponding to the scanning lines 11 in odd rows among the m scanning lines 11 will not be repeated if appropriate and common reference symbols will be denoted thereto.

The source region 30*a*1 is electrically connected to a fourth relay layer 44 formed on the upper layer side of the source region 30*a* through the contact hole 32 formed in the gate insulating film 13 and the second inter-layer insulating film 14. The fourth relay layer 44 is electrically connected through a contact hole 33 to a fifth relay layer 45 formed further on the upper layer side with the third inter-layer insulating film 15 interposed therebetween. The fifth relay layer 45 is electrically connected through a contact hole 34 to, the upper layer data line 6*a* formed further on the upper layer side with the fourth inter-layer insulating film 16 interposed therebetween.

Here, the upper layer data line 6*a* is made of a conductive material having a light shielding property such as Al (aluminum), similarly to the lower layer data line 6*b*. The upper layer data line 6*a* thus shields light coming from the front side (i.e., the upper side in FIG. 7) of the TFT array substrate 10 to prevent the wirings, the elements, and the like formed on the lower layer side of the upper layer data line 6*a* from being exposed to the light. As a result, the TFT 30 can be mostly or completely light-shielded from the back surface reflection on the TFT array substrate 10 and returning light such as light emitted from another electro-optic device and passed through a synthetic optical system in a multi-plate projector or the like, and high quality image display can be realized. Particularly in this embodiment, an excellent light shielding property can be achieved since the semiconductor layer 30*a* of the TFT 30 can be doubly light-shielded along with the lower layer data line 6*b*.

Similarly to FIG. 6, the shield layer 8 is formed on the lower layer side of the upper layer data line 6*a*. The shield layer 8 is formed to suppress or prevent coupling between the upper layer data line 6*a* and the lower layer data line 6*b* formed further on the lower layer side of the shield layer 8 with the third inter-layer insulating film 15 interposed therebetween (i.e., disturbance of respectively applied image signals by an electric field generated due to a potential difference between the upper layer data line 6*a* and the lower layer data line 6*b*).

The lower layer data line 6*b* is not electrically connected at all to the pixels corresponding to the scanning lines 11 in even rows among the m scanning lines 11.

Other features of the stacked structure for the pixel corresponding to the scanning lines 11 in even rows among the m scanning lines 11 are similar to those of the stacked structure (see FIG. 6) for the pixels corresponding to the scanning lines 11 in odd rows among the m storming lines 11 (see FIGS. 5 and 6).

Therefore, according to the electro-optic device of this embodiment, the efficiency in writing to the pixels can be significantly enhanced and higher quality of the display image can be realized by forming the data lines overlapped in double layers.

The inspection signal supplying circuit 600 (see FIG. 3) arranged in the electro-optic device according to this embodiment will be specifically described below with reference to FIGS. 9 to 12.

Figure 9:
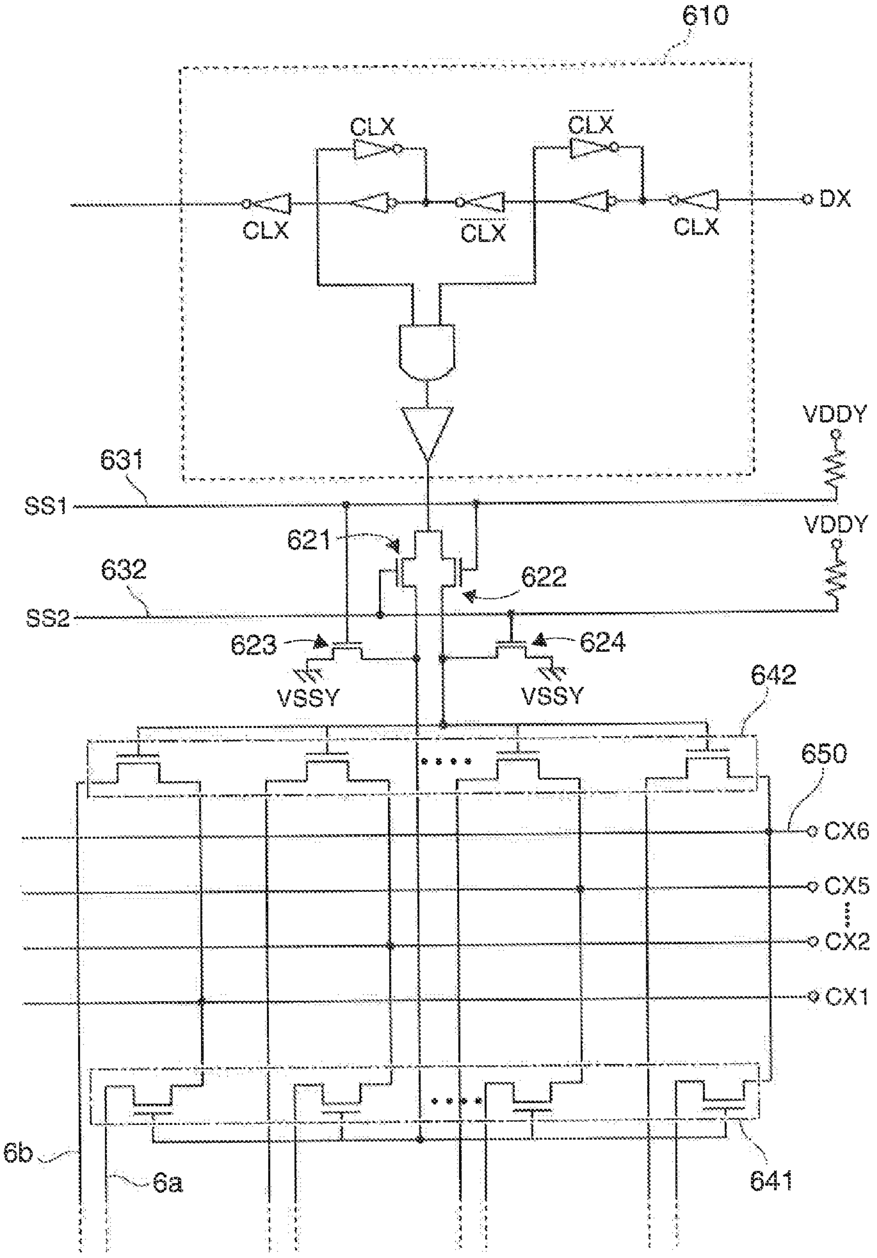
FIG. 9 is a circuit diagram showing a specific configuration of an inspection signal supplying circuit.

First, the configuration of the inspection signal supplying circuit 600 according to this embodiment will be described with reference to FIG. 9. FIG. 9 is a circuit diagram showing a specific configuration of the inspection signal supplying circuit.

In FIG. 9, the inspection signal supplying circuit 600 according to this embodiment is configured by a shift register 610, a first control transistor 621, a second control transistor 622, a third control transistor 623, a fourth control transistor 624, a first control signal supply line 631, a second control signal supply line 632, a first switching transistor 641, a second switching transistor 642, and an inspection signal supply line 650.

The shift register 610 is configured in such a manner that one data line block can be selected from a plurality of data line blocks based on an input control signal DX.

The first control transistor 621 and the fourth control transistor 624 are each electrically connected to the second control signal supply line 632 for providing a second control signal SS2. The second control transistor 622 and the third control transistor 623 are each connected to the first control signal supply line 631 for providing a first control signal SS1. The first control transistor 621, the second control transistor 622, the third control transistor 623, and the fourth control transistor 624 determine which one of the upper layer data line 6*a* and the lower layer data line 6*b* is selected based on the first control signal SS1 and the second control signal SS2.

The first switching transistor 641 is arranged between the upper layer data lines 6*a* and the inspection signal supply lines 650. When the first switching transistor 641 is turned ON, inspection signals CX1 to CX6 are respectively provided from the inspection signal supply lines 650 to the upper layer data lines 6*a*. The second switching transistor 642 is arranged between the lower layer data lines 6*b* and the inspection signal supply lines 650. When the second switching transistor 642 is turned ON, the inspection signals CX1 to CX6 are respectively provided from the inspection signal supply lines 650 to the lower layer data lines 6*b*.

Figure 10:
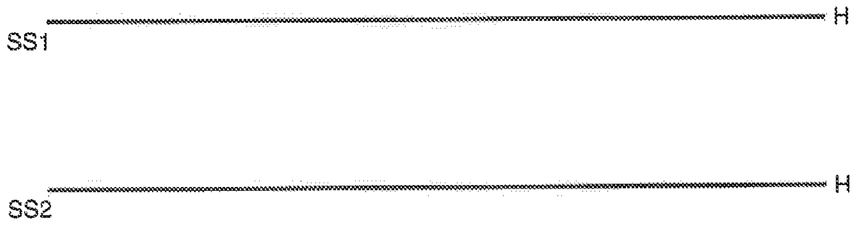
FIG. 10 is a pulse diagram showing states of a first control signal and a second control signal at the time of no-inspection.
Figure 11:
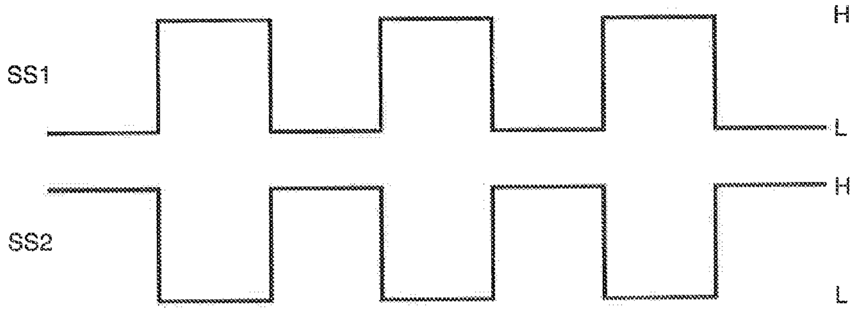
FIG. 11 is a pulse diagram showing states of the first control signal and the second control signal at the time of inspection.
Figure 12:
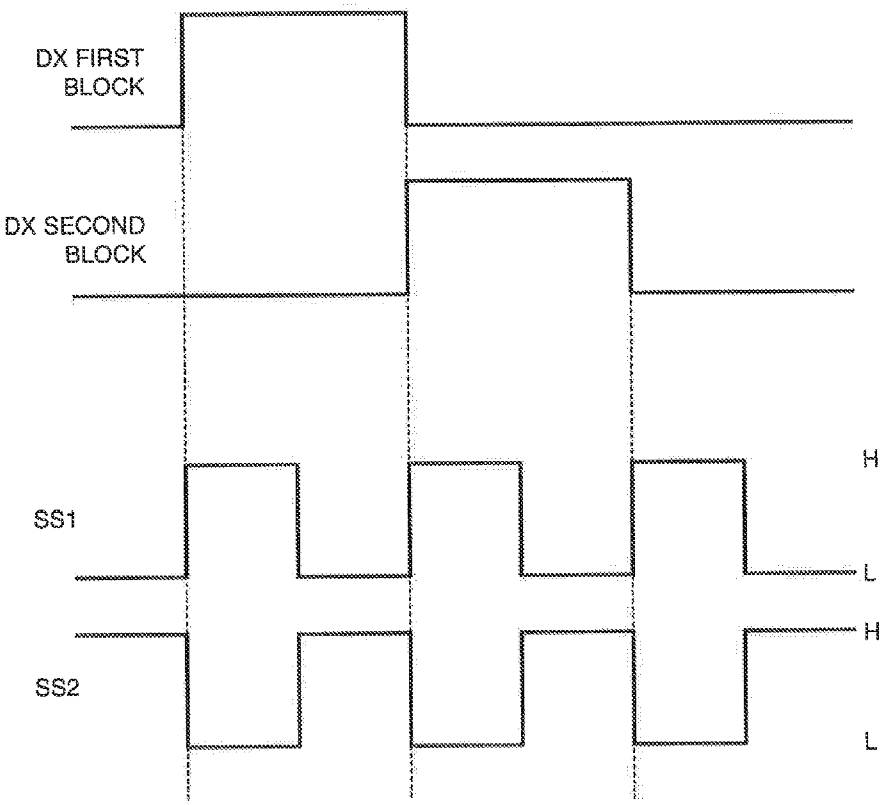
FIG. 12 is a pulse diagram showing timing signals DX along with the first control signal and the second control signal.

An operation of the inspection signal supplying circuit 600 according to this embodiment will be described below with reference to FIGS. 10 to 12 in addition to FIG. 9. FIG. 10 is a pulse diagram showing states of the first control signal and the second control signal at the time of no-inspection, and FIG. 11 is a pulse diagram showing states of the first control signal and the second control signal at the time of inspection. FIG. 12 is a pulse diagram showing the timing signals DX along with the first control signal and the second control signal.

In FIG. 10, the first control signal SS1 and the second control signal SS2, which are respectively shown in the figure, are provided at the time of no-inspection to the first control signal line 631 and the second control signal line 632 in the inspection signal supplying circuit 600 according to this embodiment. In other words, the first control signal SS1 and the second control signal SS2 at the time of no-inspection are always at the H level.

In FIG. 11, the first control signal SS1 and the second control signal SS2, which are respectively shown in the figure, are provided at the time of inspection to the first control signal line 631 and the second control signal line 632 in the inspection signal supplying circuit 600 according to this embodiment. In other words, the first control signal SS1 and the second control signal SS2 alternately take the H level and the L level at a predetermined interval. In the present embodiment, the second control signal SS2 is an inverted signal (i.e., the signal in which the phase is inverted) of the first control signal SS1.

When the control signals as shown in FIG. 11 are provided, the first control transistor 621 and the fourth control transistor 624 electrically connected to the second control signal supply line 632 are turned OFF when the second control transistor 622 and the third control transistor 623 electrically connected to the first control signal supply line 631 are turned ON. In this case, the second switching transistor 642 is turned ON and the inspection signals are provided to the lower layer data lines 6*b*.

Meanwhile, the first control transistor 621 and the fourth control transistor 624 electrically connected to the second control signal supply line 632 are turned ON when the second control transistor 622 and the third control transistor 623 electrically connected to the first control signal supply line 631 are turned OFF. In this case, the first switching transistor 641 is turned ON and the inspection signals are provided to the upper layer data lines 6*a*.

As described above, according to the inspection signal supplying circuit 600 of this embodiment, the inspection signals can be independently provided to the upper layer data lines 6*a* and the lower layer data lines 6*b*.

In FIG. 12, the signals DX input to the shift register 610 (see FIG. 9) are provided so as to correspond to respective blocks of the six data lines 6 to each of which the image signal is simultaneously provided. The width of the signal DX corresponds to the width of the sum of the period in which the first control signal SS1 and the second control signal SS2 are respectively at the H level and the period in which these control signals are respectively at the L level. The inspection signal is thus provided to each of the upper layer data line 6*a* and the lower layer data line 6*b* in units of blocks.

Specifically, the inspection signal is provided in the order of the upper layer data line 6*a* of a first block, the lower layer data line 6*b* of the first block, the upper layer data line 6*a* of a second block, the lower layer data line 6*b* of the second block, the upper layer data line 6*a* of a third block, and so on.

The drive signals DRV1 to 6 on the image signal supply side may always be at the H level at the time of inspection.

Therefore, according to the inspection signal supplying circuit 600 of this embodiment, the inspection signals can be provided in units of blocks to the plurality of data lines 6 and independently to the upper layer data lines 6*a* and the lower layer data lines 6*b*, so that the inspection can be suitably carried out while preventing complication of the circuit configuration and increase in cost even if the data lines are arranged in a stacked manner as in this embodiment.

Therefore, according to the electro-optic device of this embodiment, high quality image can be displayed and high reliability can be realized.

Electronic Device

Figure 13:
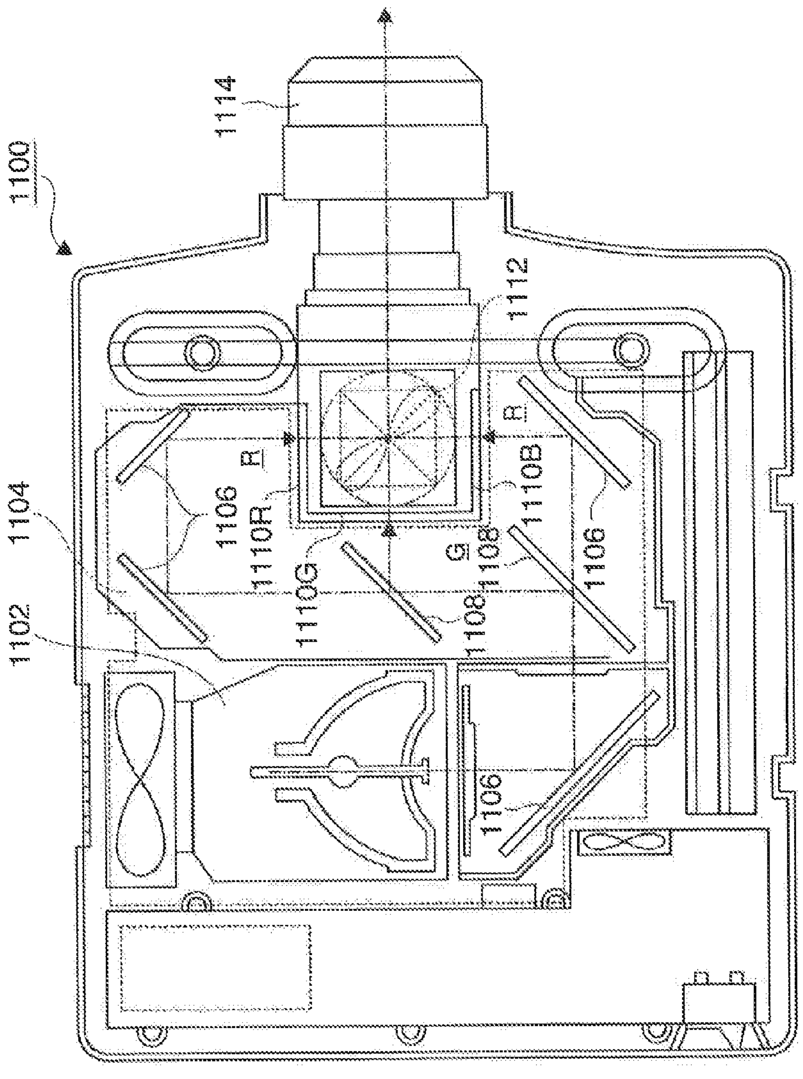
FIG. 13 is a plan view showing a configuration of a projector serving as an example of an electronic device to which the electro-optic device is applied.

Cases of applying the liquid crystal device as the electro-optic device described above to various types of electronic devices will be described below. FIG. 13 is a plan view showing a configuration example of a projector. The projector in which the liquid crystal device is used as a light bulb will be described below.

As shown in FIG. 13, a lamp unit 1102 including a white light source such as a halogen lamp or the like is arranged inside a projector 1100. Projection light emitted from the lamp unit 1102 is separated into three primary colors of RGB by four mirrors 1106 and two dichroic mirrors 1108 arranged in a light guide 1104, to be incident on liquid crystal panels 1110R, 1110B, and 1110G serving as light bulbs corresponding to the respective primary colors.

The liquid crystal panels 1110R, 1110B, and 1110G are configured similarly to the liquid crystal device described above, and are driven by primary color signals of R, G, B, respectively, provided from an image signal processing circuit. Beams modulated by these liquid crystal panels enter a dichroic prism 1112 from three directions. In the dichroic prism 1112, R and B beams refract at 90 degrees, while a G beam directly advances. Therefore, the images in the respective colors are synthesized, and consequently, a color image is projected onto a screen or the like through a projection lens 1114.

When the display images by the respective liquid crystal panels 1110R, 1110B, and 1110G are focused on, the display image by the liquid crystal panel 1110G needs to be laterally reversed with respect to the display images by the liquid crystal panels 1110R and 1110B.

No color filters need to be arranged in the liquid crystal panels 1110R, 1110B, and 1110G since the beams corresponding to the respective primary colors of R, G, and B enter by the dichroic mirrors 1108.

In addition to the electronic device described with reference to FIG. 13, there can be exemplified a mobile personal computer, a portable telephone, a liquid crystal television, a video tape recorder of a view finder type or of a monitor direct viewing type, a car navigation device, a pager, an electronic notebook, a calculator, a word processor, a work station, a television (TV) telephone, a POS terminal, a device provided with a touch panel, and the like. It should be noted that the electro-optic device of the present embodiment is also applicable to the aforementioned various types of electronic devices.

The invention is also applicable to a reflective liquid crystal device (LCOS), a plasma display (PDP), a field emission display (FED, SED), an organic EL display, a digital micro-mirror device (DMD), an electrophoretic device, and the like in addition to the liquid crystal device described in the above embodiment.

The invention is not limited to the above-described embodiment, but appropriate modifications may be made within the scope of the gist or idea of the invention understood from the claims and the entire specification. Electro-optic devices involving such modifications and electronic devices each provided with such an electro-optic device are also to be included in the technical scope of the invention.

The entire disclosure of Japanese Patent Application No. 2010-053088, filed Mar. 10, 2010 is expressly incorporated by reference herein.

What is claimed is:

1. An electro-optic device, comprising:

a plurality of pixel electrodes arrayed along a first direction and a second direction intersecting the first direction;

a data line block for providing an image signal to each of a first pixel electrode group and a second pixel electrode group in one column of the plurality of pixel electrodes arrayed in a line in the first direction, the data line block being configured by a plurality of data line pairs in which a pair of a first data line and a second data line extending in the first direction is arranged for each column, wherein the first data line is arranged such that it overlaps the second data line in a plan view;

a common gate line corresponding to each of the plurality of data line pairs;

an image signal supplying unit for sequentially providing an image signal in time-series to each of the data line pairs configuring the data line block from one end of each of the plurality of data line pairs; and an inspection voltage supplying unit for supplying an inspection voltage from another end of each of the plurality of data line pairs each to the data line block and separately to each of the first data line and the second data line.

2. The electro-optic device according to claim 1, further comprising a control signal supply unit for providing a first control signal and a second control signal to the inspection voltage supplying unit, wherein the inspection voltage supplying unit is configured to supply the inspection voltage to the first data line based on the first control signal, and supply the inspection voltage to the second data line based on the second control signal.

3. The electro-optic device according to claim 2, wherein the second control signal is an inverted signal obtained by inverting a phase of the first control signal.

4. The electro-optic device according to claim 1, wherein the inspection voltage supplying unit includes a shift register.

5. An electronic device comprising the electro-optic device according to claim 1.

6. The electro-optic device according to claim 1, further comprising a plurality of transistor pairs each including gate electrodes and respectively connected to the plurality of data line pairs, wherein the gate electrodes of each of the plurality of transistor pairs are electrically connected to the common gate line.

7. An electro-optic device, comprising:

a plurality of pixel electrodes arrayed along a first direction and a second direction intersecting the first direction;

a data line block configured to supply an image signal to each of a first pixel electrode group and a second pixel electrode group in one column of the plurality of pixel electrodes arrayed in a line in the first direction, the data line block being configured by a plurality of data line pairs in which a pair of a first data line and a second data line extending in the first direction is arranged for each column;

an image signal supplying unit configured to sequentially supply an image signal in time-series to each of the data line pairs configuring the data line block from one end of each of the plurality of data line pairs;

an inspection voltage supplying unit configured to supply an inspection voltage from an opposite end of each of the plurality of data line pairs separately to each of the first data line and the second data line; and a control signal supply unit configured to supply a first control signal and a second control signal to the inspection voltage supply unit, wherein the inspection voltage supplying unit is configured to supply the inspection voltage to the first data line and the second data line based on the first control signal and the second control signal, respectively.

8. The electro-optic device according to claim 7, wherein the first control signal and the second control signal are for controlling timings at which the inspection voltage supplying unit supplies the inspection voltage separately to the first data line and the second data line, respectively.

9. The electro-optic device according to claim 7, wherein the second control signal is a phase-inverted signal of the first control signal.

10. The electro-optic device according to claim 7, wherein the inspection voltage supplying unit includes a shift register.

11. An electronic device, comprising the electro-optic device according to claim 7.

* * * * *